United States Patent [19]

Hilz et al.

[11] Patent Number: 5,068,600
[45] Date of Patent: * Nov. 26, 1991

[54] TESTING DEVICE FOR BOTH-SIDED TWO-STAGE CONTACTING OF EQUIPPED PRINTED CIRCUIT BOARDS

[75] Inventors: Wolfgang Hilz, Munich; Rudolf Schuster, Heimstetten; Hans Schauflinger, Munich, all of Fed. Rep. of Germany

[73] Assignee: Siemens Aktiengesellschaft, Munich, Fed. Rep. of Germany

[*] Notice: The portion of the term of this patent subsequent to Jun. 20, 2006 has been disclaimed.

[21] Appl. No.: 528,340

[22] Filed: May 23, 1990

Related U.S. Application Data

[63] Continuation of Ser. No. 82,584, Aug. 7, 1987, abandoned.

[30] Foreign Application Priority Data

Aug. 7, 1986 [DE] Fed. Rep. of Germany ....... 3626758

[51] Int. Cl.$^5$ .............................................. G01R 1/04
[52] U.S. Cl. .................................. 324/158 F; 324/72.5
[58] Field of Search ............... 324/158 F, 158 P, 73.1, 324/72.5

[56] References Cited

U.S. PATENT DOCUMENTS

| 4,536,051 | 8/1985 | Smith et al. ...................... 324/158 F |
| 4,625,164 | 11/1986 | Golder et al. .................... 324/158 F |
| 4,626,779 | 12/1986 | Boyle .............................. 324/73 PC |
| 4,818,933 | 4/1989 | Kerschner et al. .............. 324/158 F |
| 4,841,241 | 6/1989 | Hilz et al. ....................... 324/73 PC |

FOREIGN PATENT DOCUMENTS

2172150 9/1986 United Kingdom ............ 324/158 P

Primary Examiner—Curtis Kuntz
Assistant Examiner—Edward Urban

[57] ABSTRACT

A testing device for both-sided two-stage contacting of equipped printed circuit boards. A lower needle adaptor has first and second resilient or spring-seated contact needles of different lengths and an upper needle adaptor has third and fourth resilient or spring-seated contact needles also differing in length, which are provided for both-sided, two-stage contacting of component equipped printed circuit boards. In all stages of the contacting, the printed circuit boards are firmly clamped between lower and upper pressure rams arranged test-specimen-associated. The testing device provides a high contacting reliability.

11 Claims, 1 Drawing Sheet

TESTING DEVICE FOR BOTH-SIDED TWO-STAGE CONTACTING OF EQUIPPED PRINTED CIRCUIT BOARDS

This is a continuation of application Ser. No. 082,584, filed Aug. 7, 1987 now abandoned.

BACKGROUND OF THE INVENTION

The invention is directed to a testing device for component equipped printed circuit boards having a lower needle adaptor which carries first and second spring-seated contact needles arranged test-specimen-associated and differing in length for two-stage contacting of the undersides of the printed circuit boards, and also having a plurality of upper pressure rams arranged test-specimen-associated.

Needle adaptors having contact pins arranged test-specimen-associated are used for the electrical testing of component equipped printed circuit boards, such as flat modules. A distinction is thereby made between a circuit test or a function and sub-function test. During the test, the component equipped printed circuit board has its solder side pressed against spring-seated contact needles arranged in the needle adaptor. When both a circuit test, as well as, a function or sub-function test are to be carried out in the same testing device, then a two-stage contacting device having contact needles of different lengths is provided. In the first stage of the contacting, only the long contact needles come into engagement during the function or, respectively, sub-function test, whereas the short contact needles are added in the second stage of the contacting during the circuit test.

A simultaneous, especially two-stage, contacting at the components side of the printed circuit board is not provided in known needle adaptors. In the course of the increasingly prevalend SMD technology, however, this demand for both-sided, two-stage contacting is required more frequently. Moreover, plug connections can often be contacted only from above insofar as one wishes to forego the involved, lateral contacting of the plugs during the function test.

The pressing of the component equipped printed circuit boards required for contacting can be mechanically undertaken via correspondingly distributed pressure rams. For example, vacuum adaptors are often utilized. The component equipped printed circuit board is manually placed on a sealing rubber therein and pressed thereagainst by producing a vacuum. In present vacuum adaptors, the advantage of better accessibility to the components side is offset by a number of disadvantages. Since an optimum degree of vacuum is not possible, inadmissibly high sags of the printed circuit boards cannot be reliably avoided, these occuring due to the high surface pressure. Moreover, the sealing represents a considerable problem, so that a reliable contacting can frequently be guaranteed only by additional supplied pressure at specific locations or on the basis of other, additional manual operations. Further, the spectrum of printed circuit boards situable for testing in the vacuum adaptor is limited since, for example, no open through-connections and passages can be present. In view of an automation of the final test of component equipped printed circuit boards, the problems cited above are even more pronounced. In particular, the contacting reliability would be further reduced by additionally occuring sealing problems given an automatic changing of the printed circuit boards.

SUMMARY OF THE INVENTION

An object of the invention is to create a testing device for contacting component equipped printed circuit boards which, given an automation-oriented structure, guarantees a high contacting reliability without the risk of inadmissibly high sags of the printed circuit boards. Moreover, the testing device satisfies the demands of SMD technology.

In a testing device of the species initially cited, this object is inventively achieved in that an upper needle adaptor is additionally provided. This upper needle adaptor carries third and fourth spring-seated contact needles arranged test-specimen-associated and differing in length for two-stage contacting of the upper side of the printed circuit boards. Also, the printed circuit boards can be clamped between upper pressure rams and a plurality of lower pressure rams arranged test-specimen-associated.

The testing device of the present invention thus enables a both-sided, two-stage contacting of a component equipped printed circuit board which, in particular, is enabled by the mechanical clamping of the printed circuit board between upper and lower pressure rams. The fixing of the printed circuit board is established independently of the number and distribution o the contact needles in every contacting stage, whereby the contacting condition is unambiguously defined at every point in time. The pressure rams are thereby a component part of the needle adaptors of the test device, these needle adaptors being interchangable in test-specimen-associated fashion.

In accord with a preferred development of the invention, the lower needle adaptor is stationarily arranged. Since the lower needle adaptor is thus not moved even during the contacting event, the electrical testing reliability is not deteriorated by a moved wiring.

A further advantageous development of the present invention is that the printed circuit board can be pressed against the stationarily arranged, lower needle adaptor, being pressed thereagainst by resiliently fashioned, upper contact rams, whereby the forces of the resilient, upper contact rams form a greater sum than the sum of the spring powers of the third and fourth contact needles. The force relationship is thus preserved at every point in time and the contacting condition is unambiguously defined.

The upper needle adaptor is preferably arranged adjustable in a vertical direction. In this case, the resilient, upper pressure rams can be rigidly arranged in the upper needle adaptor. The upper needle adaptor and the upper pressure rams can thus be moved via a common drive.

It is provided in accordance with a further development of the present invention that the lower pressure rams are adjustable in two steps in the vertical direction. As a result of this two-step adjustability, the two-stage contacting of the underside of the printed circuit board is realized in an especially simple way. The lower pressure rams are thereby preferably guided in the lower needle adaptor and are actuatable via a lower, common pressure plate. Given a test-specimen-associated replacement of the lower needle adaptor comprising the lower pressure rams, the pressure plate and its drive can then always remain in the testing device.

A precise and especially simple positioning of the printed circuit boards is achieved, finally, in that at least two centering pins leading the upper pressure rams are arranged in the upper needle adaptor.

BRIEF DESCRIPTION OF THE DRAWINGS

The features of the present invention which are believed to be novel, are set forth with particularly in the appended claims. The invention, together with further objects and advantages, may best be understood by reference to the following description taken in conjunction with the accompanying drawings, in the several FIGURES in which like reference numerals identify like elements, and in which:

BRIEF DESCRIPTION OF THE PREFERRED EMBODIMENT

Figure 1:
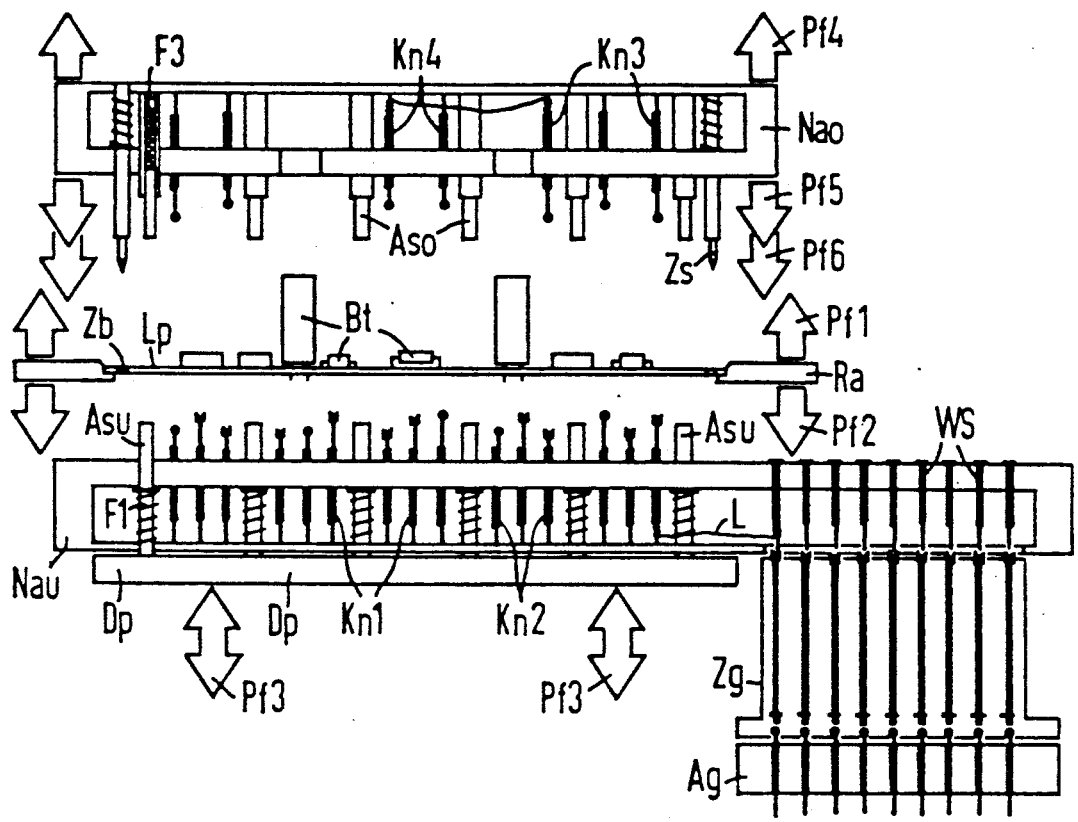
FIG. 1 is a schematic drawing depicting the testing device for both-sided, two-stage contacting of a component equipped printed circuit board.

FIG. 1 shows a printed circuit board Lp equipped with various components Bt. This printed circuit board Lp is placed in an outer frame Ra. Arrows Pf1 and Pf2 indicate that the frame Ra is moveable up and down in a vertical direction, whereby this mobility of the frame Ra and printed circuit board Lp can be realized, for example, by means of a resilient suspension.

A stationarily arranged, lower needle adaptor Nau is situated under the printed circuit board Lp. This lower needle adaptor Nau carries first resilient or spring-seated contact needles Kn1 and somewhat shorter, second resilient or spring-seated contact needles Kn2. It is indicated at one location that the contact needles Kn1 and Kn2 are connected via lines L to allocated wrap spines WS. The wrap spines WS are arranged outside of the contacting region in the lower needle adaptor Nau and are in turn connected to the needles (not referenced in detail) of a connector member Ag, being connected thereto via an adaptor or intermediate element Zg having resilient needles which are likewise not referenced in detail. This connector member Ag is part of the actual automatic testing unit which, for example, can be a "series 700" of Factron-Schlumberger, Albert Schweitzer Strasse 66, D-8000 Munich 83.

Lower pressure rams referenced Asu are further guided in the lower needle adaptor Nau, these lower pressure rams Asu being held in the needle adaptor Asu and moveable in a vertical direction via springs F1. The lower pressure rams Asu are thus not resiliently fashioned but are adjustable in two steps in the vertical direction via a common, lower pressure plate Dp. This two-step adjustability indicated by double arrows Pf3 can, for example, be realized by pneumatically or hydraulically actuatable adjustment cylinders arranged under the pressure plate Dp.

An upper needle adaptor Nao arranged adjustable in the vertical direction is situated above the printed circuit board Lp, this upper needle adaptor Nao carries third spring-seated contact needles Kn3 and somewhat shorter fourth spring-seated contact needles Kn4. The further wiring (not shown in detail) of the contact needles Kn3 and Kn4 have feeder contacts to the lower needle adaptor Nau, so that the upper testing contacts which are usually few in number are likewise connected to the automatic testing unit via the interface of the adaptor member Zg.

Upper pressure rams referenced Aso are rigidly arranged in the upper needle adaptor Nao. These upper pressure rams Aso are resiliently fashioned in telescoping fashion, whereby this resilient design is shown at one location by a corresponding spring F3. Two centering pins Zs likewise arranged in the upper needle adaptor Nao have the function of penetrating into allocated centering bores of the printed circuit board Lp and, thus, of precisely positioning the printed circuit board Lp.

The vertical adjustability of the upper needle adaptor Nao is shown with arrows Pf4, Pf5 and Pf6, whereby the two downwardly directed arrows Pf5 and Pf6 are intended to symbolize the two-stage nature of the contacting. The vertical adjustment can be realized, for example, in that the upper needle adaptor Nao is guided in a solid four-column frame and, dependent on the adaptor size, is driven via a dc motor by one through four spindles synchronized with toothed belts. The described drive of the contacting mechanism is thereby executed as a programmable positioning shaft.

Figure 2:
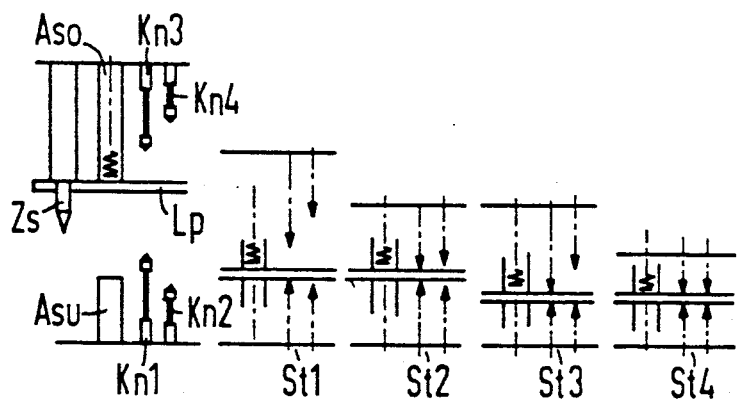
FIG. 2 is a schematic drawing depicting the individual stages in the contacting of the testing device of FIG. 1.

A preferred exemplary embodiment of the sequence of the contacting of the printed circuit board Lp in the testing device shown in FIG. 1 shall be set forth below with additional reference to the contacting pattern illustrated in FIG. 2. A lower pressure ram Asu, lower first and second contact needles Kn1 and, respectively, Kn2, a part of the printed circuit board Lp to be contacted, an upper pressure ram Aso, a centering pin Zs, upper third and fourth contact needles Kn3 and, respectively, Kn4 are shown in a greatly simplified illustration at the left-hand side of FIG. 2. A position in the initial stage of the contacting stroke of the upper needle adaptor is thereby shown in which the centering pins Zs have penetrated into the allocated centering bores Zb of the printed circuit board Lp and whereby the resilient, upper pressure rams Aso are also already pressing against the printed circuit board Lp. The four, following contacting stages St1, St2, St3 and St4 are shown at the right of this illustration with the contacting needles merely indicated with arrows.

The contacting of the underside of the printed circuit board Lp by the first contact needles Kn1 ensues in the first contacting stage St1. Here, the lower pressure rams Asu act as a detent which limits the downward stroke of the printed circuit board Lp. The printed circuit Lp is thereby firmly clamped between the lower pressure rams Asu and the upper pressure rams Aso, i.e. the contacting condition of the contacting stage St1 is unambiguously defined.

In the second contacting stage St2, the upper pressure rams Aso arranged in the upper needle adaptor Nao have resiliently yielded to such a degree that a reliable contacting of the upper side of the printed circuit board Lp by the third contact needles Kn3 is now also present.

In the third contacting stage St3, the pressure plate Dp assumes its lower position indicated by the downward direction of the arrows Pf3. A reliable contacting of the underside of the printed circuit board by the second contact needles Kn2 is now guaranteed by the appropriately lower position of the lower pressure rams Asu and of the printed circuit board Lp.

In the fourth contacting stage St4, finally, a contacting of the upper side of the printed circuit board by the fourth contact needles Kn4 has occurred on the basis of a further downward motion of the upper needle adaptor Nao given simultaneous, further resilient yielding of the upper pressure rams Aso.

It may be seen that respectively unambiguously defined contacting conditions are guaranteed by a firm clamping of the printed circuit board Lp between the lower and upper pressure rams Asu and, respectively, Aso not only in the first contacting stage St1 but also in the following contacting stages St2, St3 and St4. It may also be seen that some variations are possible for the sequence of the contactings.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A testing device for component equipped printed circuit boards, comprising:
   a lower needle adaptor which carries first and second resilient contact needles arranged test-specimen-associated and differing in length for two-stage contacting of an underside of the printed circuit board, and having a plurality of lower pressure rams arranged test-specimen-associated, said lower pressure rams acting directly on the printed circuit board and being arranged distributed over the surface of the circuit board;
   an additional upper needle adaptor carrying third and fourth, resilient contact needles arranged test-specimen-associated and differing in length for two-stage contacting of the upper side of the printed circuit boards and having a plurality of upper pressure rams arranged test-specimen-associated, said upper pressure rams acting directly on the printed circuit board and being arranged distributed over the surface of the circuit board; and
   said upper pressure rams and said lower pressure rams being capable of clamping the circuit board therebetween to provide distributed support of the printed circuit board during testing of the circuit board.

2. The testing device according to claim 1, wherein said lower needle adaptor is stationarily arranged.

3. The testing device according to claim 2, wherein the printed circuit board is pressed against said stationarily arranged, lower needle adaptor with resiliently fashioned, upper pressure rams, whereby the forces of said resilient, upper pressure rams are greater in sum than the sum of the spring forces of the first and second contact needles.

4. The testing device according to claim 1, wherein said upper needle adaptor is arranged adjustable in a vertical direction.

5. The testing device according to claim 3, wherein said resilient, upper pressure rams are rigidly arranged in said upper needle adaptor.

6. The testing device according to claim 1, wherein the lower pressure rams are adjustable in two-steps in a vertical direction.

7. The testing device according to claim 6, wherein said lower pressure rams are guided in said lower needle adaptor and are actuatable via a lower, common pressure plate.

8. The testing device according to claim 1, wherein at least two centering pins leading said upper pressure rams are arranged in said upper needle adaptor for positioning said printed circuit boards.

9. A testing device for a two-sided component equipped printed circuit board, comprising:
   means for holding a twosided component equipped printed circuit board kin a predetermined centered position; and
   means for selectively contacting the printed circuit board with a plurality of electrical contacts in at least three contact stages for electrical testing of the circuit board;
   said means for selectively contacting including,
   a lower needle adaptor having first and second resiliently mounted contact needles arranged test-specimen-associated, said first contact needles being mounted to extend a different distance than said second contact needles when in a relaxed condition,
   an upper needle adaptor having third and fourth resiliently mounted contact needles arranged test-specimen-associated, said third contact needles being mounted to extend a different distance than said fourth contact needles when in a relaxed condition,
   lower pressure rams associated with said lower needle adaptor and arranged test-specimen-associated, said lower pressure rams having at least a first and second position wherein said first position holds the printed circuit board pressed there against in contact with said first contact needles and out of contact with said second contact needles, and said second position holds the printed circuit board pressed there against in contact with both said first and second contact needles, and
   upper pressure rams associated with said upper needle adaptor and arranged test-specimen-associated, said upper pressure rams having at least two positions.

10. A testing device as claimed in claim 9, wherein said upper pressure rams are resiliently mounted.

11. A testing device as claimed in claim 9, wherein said upper pressure rams extend closer to a circuit board to be tested when in a fully extended position than either of said third and fourth contact needles, and wherein said means for selectively contacting is operable to selectively contact said printed circuit board in four contact stages.

* * * * *